United States Patent
Fujita et al.

(10) Patent No.: US 7,211,514 B2
(45) Date of Patent: May 1, 2007

(54) HEAT-PROCESSING METHOD FOR SEMICONDUCTOR PROCESS UNDER A VACUUM PRESSURE

(75) Inventors: Takehiko Fujita, Tokyo (JP); Akitake Tamura, Tokyo (JP); Keisuke Suzuki, Tokyo (JP); Kazuhide Hasebe, Tokyo (JP); Mitsuhiro Okada, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/924,959

(22) Filed: Aug. 25, 2004

(65) Prior Publication Data

US 2005/0095826 A1 May 5, 2005

(30) Foreign Application Priority Data

Aug. 28, 2003 (JP) ............................. 2003-304297

(51) Int. Cl.
*H01L 21/44* (2006.01)
(52) U.S. Cl. ...................................... 438/680; 438/778
(58) Field of Classification Search ................ 438/307, 438/680–681, 795–799
See application file for complete search history.

(56) References Cited

U.S. PATENT DOCUMENTS 6,461,961 B1 * 10/2002 Sano et al. .................. 438/686

FOREIGN PATENT DOCUMENTS

JP       2003-100645       4/2003

* cited by examiner

*Primary Examiner*—Dung A. Le
(74) *Attorney, Agent, or Firm*—Oblon, Spivak, McClelland, Maier & Neustadt, P.C.

(57) ABSTRACT

A method for subjecting target substrates to a heat process under a vacuum pressure includes a transfer step, heating-up and pressure-reducing step, and heat-processing step. The transfer step is arranged to transfer into a reaction chamber a holder that supports the substrates at intervals. The heating-up and pressure-reducing step following the transfer step is arranged to heat up the reaction chamber to a process temperature, and exhaust the reaction chamber to a process pressure. During the heating-up and pressure-reducing step, the reaction chamber is set at the process pressure after being set at the process temperature, to form a state where the reaction chamber has the process temperature under a pressure higher than the process pressure. The heat-processing step following the heating-up and pressure-reducing step is arranged to subject the substrates to the heat process at the process temperature and process pressure.

14 Claims, 5 Drawing Sheets

| Pressure in heat-up Heat-up rate | | 100Pa | 240Pa | 465Pa | 1000Pa |
|---|---|---|---|---|---|
| 50°C / min. | T | 29 | 9 | 1 | 6 |
| | C | 18 | 9 | 0 | 4 |
| | B | 12 | 3 | 2 | 0 |

(Number of particles)

FIG. 6A

| Pressure in heat-up Heat-up rate | | 100Pa | 1000Pa | 6650Pa |
|---|---|---|---|---|
| 100°C / min. | T | 90 | 5 | 3 |
| | C | 19 | 8 | 3 |
| | B | 73 | 9 | 0 |

(Number of particles)

FIG. 6B

HEAT-PROCESSING METHOD FOR SEMICONDUCTOR PROCESS UNDER A VACUUM PRESSURE

CROSS-REFERENCE TO RELATED APPLICATIONS

This application is based upon and claims the benefit of priority from prior Japanese Patent Application No. 2003-304297, filed Aug. 28, 2003, the entire contents of which are incorporated herein by reference.

BACKGROUND OF THE INVENTION

1. Field of the Invention

The present invention relates to a heat-processing method and apparatus for a semiconductor process, which are used for subjecting a plurality of target substrates to a heat process under a vacuum pressure. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices, heat-processing apparatuses are used for performing heat processes, such as CVD (Chemical Vapor Deposition) and oxidation, on a target substrate, such as a semiconductor wafer. For example, where a vertical heat-processing apparatus of the batch type is used as a heat-processing apparatus, a heat process is performed, as follows.

At first, the interior of the reaction tube of the heat-processing apparatus is heated up (increase in temperature) by a heater to a predetermined load temperature, such as 400° C., and a wafer boat that holds a plurality of semiconductor wafers is loaded. Then, the interior of the reaction tube is heated to a predetermined process temperature, such as 800° C. Furthermore, gas within the reaction tube is exhausted through an exhaust port, so that the pressure in the reaction tube is reduced to a predetermined pressure, such as 53.2 Pa (0.4 Torr).

Then, the interior of the reaction tube is kept at the predetermined temperature and pressure (kept exhausted), a process gas is supplied through a process gas feed line into the reaction tube. For example, in the case of CVD, when a process gas is supplied into a reaction tube, the process gas causes a thermal reaction and thereby produces reaction products. The reaction products are deposited on the surface of a semiconductor wafer, and form a thin film on the surface of the semiconductor wafer.

BRIEF SUMMARY OF THE INVENTION

An object of the present invention is to provide a heat-processing method and apparatus for a semiconductor process, which suppresses deposition of particles on a target substrate.

According to a first aspect of the present invention, there is provided a heat-processing method for subjecting a plurality of target substrates to a heat process under a vacuum pressure, the method comprising: a transfer step of transferring into a reaction chamber a holder that supports the target substrates at predetermined intervals; and a heating-up and pressure-reducing step of heating up and pressure-reducing an interior of the reaction chamber, which accommodates the holder transferred by the transfer step and supporting the target substrates, wherein the heating-up and pressure-reducing step is arranged to start reducing the pressure of the interior of the reaction chamber, 1 to 5 minutes after starting heating up the interior of the reaction chamber.

According to this arrangement, the pressure of the interior of the reaction chamber starts being reduced, 1 to 5 minutes after the interior of the reaction chamber starts being heated up. The period of time is thereby prolonged during which the interior of the reaction chamber is heated up (increase in temperature) under a higher pressure close to a normal pressure. In this case, chippings (particles) of the target substrates or holder generated due to heating up of the interior of the reaction chamber are easily purged out from the reaction chamber, so that deposition of particles on the target substrates is suppressed.

According to a second aspect of the present invention, there is provided a heat-processing method for subjecting a plurality of target substrates to a heat process under a vacuum pressure, the method comprising: a transfer step of transferring into a reaction chamber a holder that supports the target substrates at predetermined intervals; and a heating-up and pressure-reducing step of heating up and pressure-reducing an interior of the reaction chamber, which accommodates the holder transferred by the transfer step and supporting the target substrates, wherein the heating-up and pressure-reducing step is arranged to reduce the pressure of the interior of the reaction chamber to a predetermined pressure, at a pressure-reducing rate of from 66.5 Pa/sec to 266 Pa/sec, while heating up the interior of the reaction chamber.

According to this arrangement, the pressure of the interior of the reaction chamber is reduced to a predetermined pressure, at a pressure-reducing rate of from 66.5 Pa/sec to 266 Pa/sec, while the interior of the reaction chamber is heated up. The period of time is thereby prolonged during which the interior of the reaction chamber is heated up (increase in temperature) under a higher pressure close to a normal pressure. In this case, chippings (particles) of the target substrates or holder generated due to heating up of the interior of the reaction chamber are easily purged out from the reaction chamber, so that deposition of particles on the target substrates is suppressed.

According to a third aspect of the present invention, there is provided a heat-processing method for subjecting a plurality of target substrates to a heat process under a vacuum pressure, the method comprising: a transfer step of transferring into a reaction chamber a holder that supports the target substrates at predetermined intervals; and a heating-up and pressure-reducing step of heating up and pressure-reducing an interior of the reaction chamber, which accommodates the holder transferred by the transfer step and supporting the target substrates, wherein the heating-up and pressure-reducing step is arranged to once reduce the pressure of the interior of the reaction chamber to a pressure, at which chippings of the target substrates or holder are not purged out from the reaction chamber, and then heat up the interior of the reaction chamber to a predetermined temperature, while keeping the pressure of the interior of the reaction chamber at a pressure for purging out the chippings from the reaction chamber, which is higher than the former reduced pressure.

According to this arrangement, the pressure of the interior of the reaction chamber is once reduced to a pressure, at which chippings of the target substrates or holder are not purged out from the reaction chamber, and is then kept at a pressure for purging out the chippings from the reaction chamber, which is higher than the former reduced pressure, while the interior of the reaction chamber is heated up to a predetermined temperature. In this case, chippings generated due to heating up (increase in temperature) of the interior of the reaction chamber are easily purged out from the reaction chamber, so that deposition of particles on the target substrates is suppressed.

It is preferable to set the heating-up and pressure-reducing step to once reduce the pressure of the interior of the reaction chamber to be less than 133 Pa, and then heat up the interior of the reaction chamber to a predetermined temperature, while keeping the interior pressure of the reaction chamber within a range of from 133 Pa to 2660 Pa.

It is preferable to set the heating-up and pressure-reducing step to supply an inactive gas into the reaction chamber. In this case, generated chippings are more easily purged out from the reaction chamber, so that deposition of particles on the target substrates is further suppressed. It is preferable to set the heating-up and pressure-reducing step to supply the inactive gas into the reaction chamber at least at 10 liters/min.

For example, the target substrate is a semiconductor wafer, and the holder is made of, e.g., quartz.

According to a fourth aspect of the present invention, there is provided a heat-processing apparatus for subjecting a plurality of target substrates to a heat process under a vacuum pressure, the apparatus comprising: transfer means for transferring into a reaction chamber a holder that supports the target substrates at predetermined intervals; heating-up and pressure-reducing means for heating up and pressure-reducing an interior of the reaction chamber, which accommodates the holder transferred by the transfer means and supporting the target substrates; and control means for controlling the heating-up and pressure-reducing means to start reducing the pressure of the interior of the reaction chamber, 1 to 5 minutes after starting heating up the interior of the reaction chamber.

According to this arrangement, control is performed such that the pressure of the interior of the reaction chamber starts being reduced, 1 to 5 minutes after the interior of the reaction chamber 2 starts being heated up. The period of time is thereby prolonged during which the interior of the reaction chamber is heated up (increase in temperature) under a higher pressure close to a normal pressure. In this case, chippings (particles) of the target substrates or holder generated due to heating up of the interior of the reaction chamber are easily purged out from the reaction chamber, so that deposition of particles on the target substrates is suppressed.

According to a fifth aspect of the present invention, there is provided a heat-processing apparatus for subjecting a plurality of target substrates to a heat process under a vacuum pressure, the apparatus comprising: transfer means for transferring into a reaction chamber a holder that supports the target substrates at predetermined intervals; heating-up and pressure-reducing means for heating up and pressure-reducing an interior of the reaction chamber, which accommodates the holder transferred by the transfer means and supporting the target substrates; and control means for controlling the heating-up and pressure-reducing means to reduce the pressure of the interior of the reaction chamber to a predetermined pressure, at a pressure-reducing rate of from 66.5 Pa/sec to 266 Pa/sec, while heating up the interior of the reaction chamber.

According to this arrangement, control is performed such that the pressure of the interior of the reaction chamber is reduced to a predetermined pressure, at a pressure-reducing rate of from 66.5 Pa/sec to 266 Pa/sec, while the interior of the reaction chamber is heated up. The period of time is thereby prolonged during which the interior of the reaction chamber is heated up (increase in temperature) under a higher pressure close to a normal pressure. In this case, chippings (particles) of the target substrates or holder generated due to heating up of the interior of the reaction chamber are easily purged out from the reaction chamber, so that deposition of particles on the target substrates is suppressed.

According to a sixth aspect of the present invention, there is provided a heat-processing apparatus for subjecting a plurality of target substrates to a heat process under a vacuum pressure, the apparatus comprising: transfer means for transferring into a reaction chamber a holder that supports the target substrates at predetermined intervals; heating-up and pressure-reducing means for heating up and pressure-reducing an interior of the reaction chamber, which accommodates the holder transferred by the transfer means and supporting the target substrates; and control means for controlling the heating-up and pressure-reducing means to once reduce the pressure of the interior of the reaction chamber to a pressure, at which chippings of the target substrates or holder are not purged out from the reaction chamber, and then heat up the interior of the reaction chamber to a predetermined temperature, while keeping the pressure of the interior of the reaction chamber at a pressure for purging out the chippings from the reaction chamber, which is higher than the former reduced pressure.

According to this arrangement, control is performed such that the pressure of the interior of the reaction chamber is once reduced to a pressure, at which chippings of the target substrates or holder are not purged out from the reaction chamber, and is then kept at a pressure for purging out the chippings from the reaction chamber, which is higher than the former reduced pressure, while the interior of the reaction chamber is heated up to a predetermined temperature. In this case, generated chippings are easily purged out from the reaction chamber, so that deposition of particles on the target substrates is suppressed.

It is preferable for the control means to control the heating-up and pressure-reducing means to once reduce the pressure of the interior of the reaction chamber to be less than 133 Pa, and then heat up the interior of the reaction chamber to a predetermined temperature, while keeping the pressure of the interior of the reaction chamber within a range of from 133 Pa to 2660 Pa.

The apparatus preferably further comprises inactive gas supply means for supplying an inactive gas into the reaction chamber. In this case, the control means controls the heating-up and pressure-reducing means to heat up and pressure-reduce the interior of the reaction chamber, while controlling the inactive gas supply means to supply an inactive gas into the reaction chamber.

It is preferable for the control means to control the heating-up and pressure-reducing means to heat up and pressure-reduce the interior of the reaction chamber, while controlling the inactive gas supply means to supply an inactive gas at least at 10 liters/min into the reaction chamber. For example, the target substrate is a semiconductor wafer, and the holder is made of, e.g., quartz.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A and 6B are diagrams showing the number of deposited particles on a semiconductor wafer, observed with changes in heat-up rate and pressure in heating-up.

DETAILED DESCRIPTION OF THE INVENTION

Figure 1:
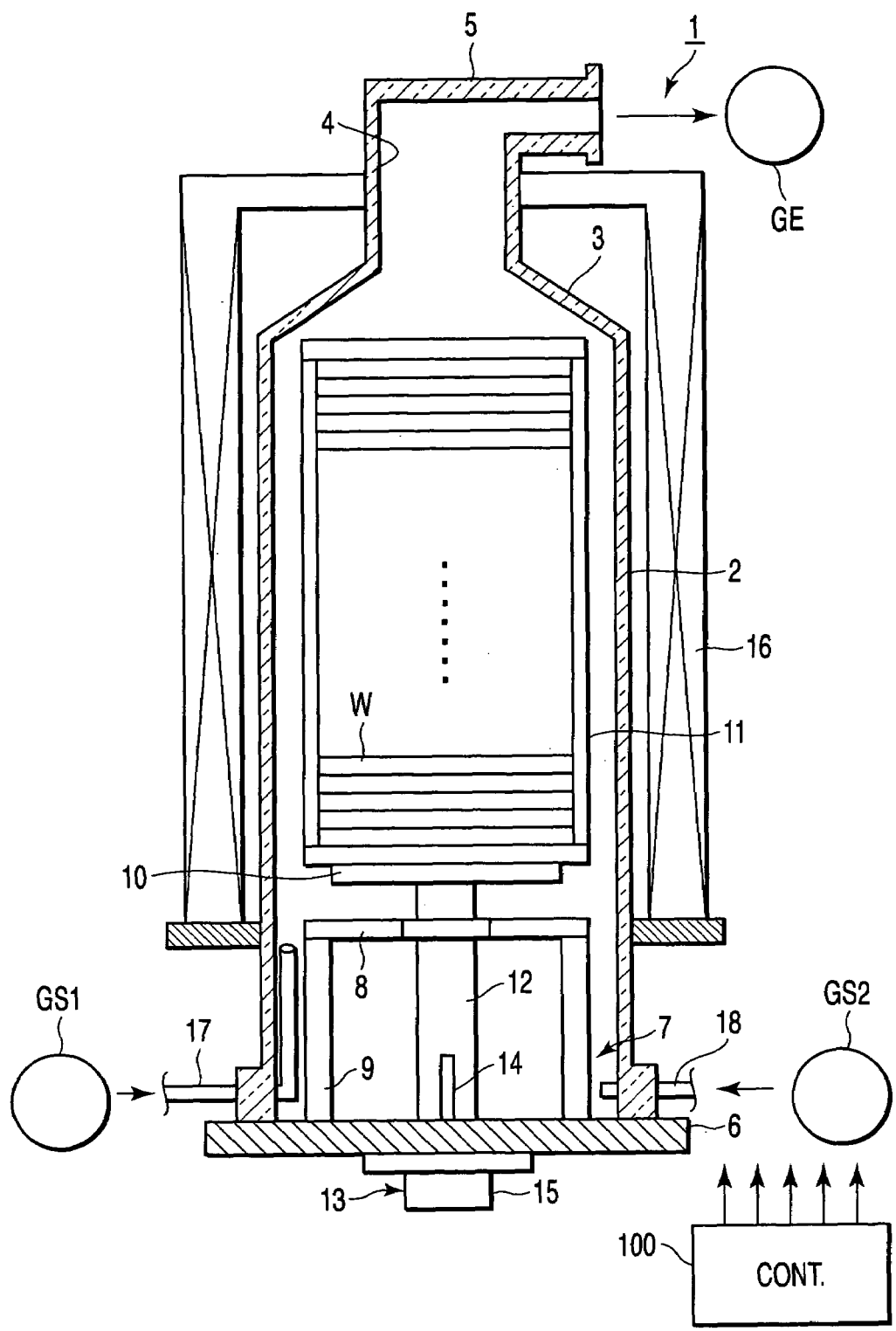
FIG. 1 is a view showing a vertical heat-processing apparatus according to an embodiment of the present invention.

In the process of developing the present invention, the inventors studied problems with regard to heat-processing methods and apparatuses for semiconductor processes. As a result, the inventors have arrived at the findings given below.

Where the interior of a reaction tube is pressure-reduced to a predetermined pressure and is heated up from a load temperature to a process temperature, chippings (fragments of semiconductor wafers and a wafer boat) are generated. The chippings are generated due to the different thermal expansion coefficients of silicon that forms the semiconductor wafers and quartz that forms the wafer boat. Specifically, when the semiconductor wafers and the wafer boat cause friction at the contacting portions therebetween due to the expansion difference, they are chipped and generate chippings. The chippings drop onto semiconductor wafers therebelow and are deposited as particles on the semiconductor wafers.

In order to solve this problem, for example, Jpn. Pat. Appln. KOKAI Publication No. 2003-100645 (patent publication 1) discloses a method for suppressing generation of particles of this kind. In this method, the transfer speed of a wafer boat is increased. Furthermore, the interior of a reaction tube is heated to a predetermined process temperature under a normal pressure, and then the pressure thereof is reduced.

In recent years, manufacture of semiconductor devices has been shifting from "small item large volume production" to "large item variable volume production". In order to meet the "large item variable volume production" demand, it is important to shorten the TAT (Turn Around Time) of manufacturing apparatuses. For example, it is necessary to increase a heat-up rate of heating up the interior of a reaction tube from a load temperature to a process temperature. Accordingly, slow heating-up, e.g., at a heat-up rate of 5° C./min, as disclosed in the patent publication 1, is not preferable.

In light of a short TAT, for example, it is required to perform heating-up from a load temperature to a process temperature, at a higher heat-up rate of, e.g., 50° C./min to 200° C./min. It is also required to reduce the pressure in a reaction tube to a predetermined pressure, at a predetermined pressure-reducing rate of, e.g., 532 Pa/sec (4 Torr/sec).

However, where the heat-up rate is greatly increased, semiconductor wafers and a wafer boat tend to cause friction at the contacting portions therebetween, thereby generating chippings (particles). As a consequence, particles are likely to be deposited on the semiconductor wafers. On the other hand, in light of productivity and cost improvement, the diameter of semiconductor wafers has been increased. With the increase in the diameter of semiconductor wafers, it is more likely to generate chippings (particles). However, demands on reducing the number of particles deposited on semiconductor wafers are becoming increasingly stricter.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a view showing a vertical heat-processing apparatus according to an embodiment of the present invention. As shown in FIG. 1, the heat-processing apparatus 1 includes an essentially cylindrical reaction tube 2 whose longitudinal direction is set in the vertical direction. The reaction tube 2 is made of a heat-resistant material, such as quartz.

The top of the reaction tube 2 is formed as an essentially conical ceiling 3 whose diameter decreases toward the top. The ceiling 3 has an exhaust port 4 formed at the center, for exhausting gas within the reaction tube 2. The exhaust port 4 is connected to an exhaust section GE through an airtight exhaust line 5. The exhaust section GE has a pressure adjusting mechanism including, e.g., a valve and a vacuum exhaust pump. The exhaust section GE is used to exhaust the atmosphere within the reaction tube 2, and set it at a predetermined pressure (vacuum level).

A lid 6 is disposed below the reaction tube 2. The lid 6 is moved up and down by a boat elevator (not shown). When the lid 6 is moved up by the boat elevator, the bottom of the reaction tube 2 (load port) is closed. When the lid 6 is moved down by the boat elevator, the bottom of the reaction tube 2 (load port) is opened.

A thermally insulating cylinder 7 is disposed on the lid 6. The thermally insulating cylinder 7 is provided with a planar heater 8 made of a resistive heating body to prevent temperature within the reaction tube from decreasing due to heat radiation from the load port of the reaction tube 2. The heater 8 is supported at a predetermined height level relative to the top face of the lid 6 by a cylindrical support 9.

A rotary table 10 is disposed above the thermally insulating cylinder 7. The rotary table 10 is used as a table for rotatably mounting thereon a wafer boat 11 that holds target substrates, such as semiconductor wafers W. Specifically, the rotary table 10 is connected to a rotary shaft 12 disposed therebelow. The rotary shaft 12 passes through the center of the heater 8 and is connected to a rotary mechanism 13 for rotating the rotary table 10.

The rotary mechanism 13 is mainly formed of a motor (not shown), and a rotation feeder 15 with an axle 14 that airtightly penetrates the lid 6 from below. The axle 14 is coupled to the rotary shaft 12 of the rotary table 10, to transmit the rotational force of the motor to the rotary table 10 through the rotary shaft 12. When the axle 14 is rotated by the motor of the rotary mechanism 13, the rotational force of the axle 14 is transmitted to the rotary shaft 12, and the rotary table 10 is rotated.

The wafer boat 11 is configured to hold a plurality of, e.g., 100, semiconductor wafers W with a predetermined gap therebetween in the vertical direction. The wafer boat 11 is made of, e.g., quartz, (accordingly, the wafers W are supported by quartz portions of the wafer boat 11). Since the wafer boat 11 is mounted on the rotary table 10, the wafer boat 11 is rotated along with the rotary table 10, and thus the semiconductor wafers W held in the wafer boat 11 are rotated.

A heater 16 made of, e.g., a resistive heating body, used for heating-up is disposed around or surrounds the reaction tube 2. The interior of the reaction tube is heated by the heater 16, so that the semiconductor wafers W are heated up (increase in temperature) to a predetermined temperature.

A process gas feed line 17 penetrates the side of the reaction tube 2 near the bottom, and is used for supplying a process gas into the reaction tube 2. The process gas feed line 17 is connected to a process gas supply source GS1 through a mass-flow controller (MFC)(not shown). The process gas feed line 17 is made of, e.g., stainless steel (SUS). Although FIG. 1 shows only one process gas feed line 17, a plurality of process gas feed lines 17 may be connected to the side of the reaction tube 2, e.g., near the bottom. In this case, a process gas is supplied through the plurality of process gas feed lines 17 into the reaction tube 2, and thereby more uniformly spreads in the reaction tube 2.

A purge gas supply line 18 also penetrates the side of the reaction tube 2 near the bottom. The purge gas supply line 18 is connected to a purge gas supply source GS2 through a MFC (not shown), so that a predetermined amount of purge gas can be supplied into reaction tube 2.

The pressure adjusting mechanism disposed on the exhaust line 5, the boat elevator, the heater 8, the motor of the rotary mechanism 13, the heater 16, and the MFCs disposed on the process gas feed line 17 and purge gas supply line 18 are connected to a control section 100. The control section 100 is formed of a microprocessor, process controller, or the like. The control section 100 measures the temperature, pressure, and so forth of the respective components of the heat-processing apparatus 1, and transmits control signals or the like to the components, on the basis of measurement data. The control section 100 thus controls the respective components of the heat-processing apparatus 1, in accordance with a recipe (time sequence) as shown in any one of FIGS. 2 to 4.

Next, an explanation will be given of a heat-processing method performed in the heat-processing apparatus 1 described above. This heat-processing method is conceived to perform a heat process on a plurality of target substrates under a vacuum pressure, and includes a transfer step, a heating-up and pressure-reducing step, and a heat-processing step. The transfer step is arranged to transfer a holder that supports the target substrates at predetermined intervals into a reaction chamber. The heating-up and pressure-reducing step, which follows the transfer step, is arranged to heat up the interior of the reaction chamber to a process temperature, and exhaust the interior of the reaction chamber to reduce the pressure thereof to a process pressure. During the heating-up and pressure-reducing step, the interior of the reaction chamber is set at the process pressure after it is set at the process temperature, so as to form a state where the interior of the reaction chamber has the process temperature under a pressure higher than the process pressure. The heat-processing step, which follows the heating-up and pressure-reducing step, is arranged to perform the heat process on the target substrates at the process temperature and the process pressure.

In the following embodiments, three heat-processing methods in accordance with recipes shown in FIGS. 2 to 4 will be explained, using examples where a process gas is supplied into the reaction tube 2 to form a thin film on semiconductor wafers W. In these examples, the respective components of the heat-processing apparatus 1 are operated under the control of the control section 100.

Figure 2:
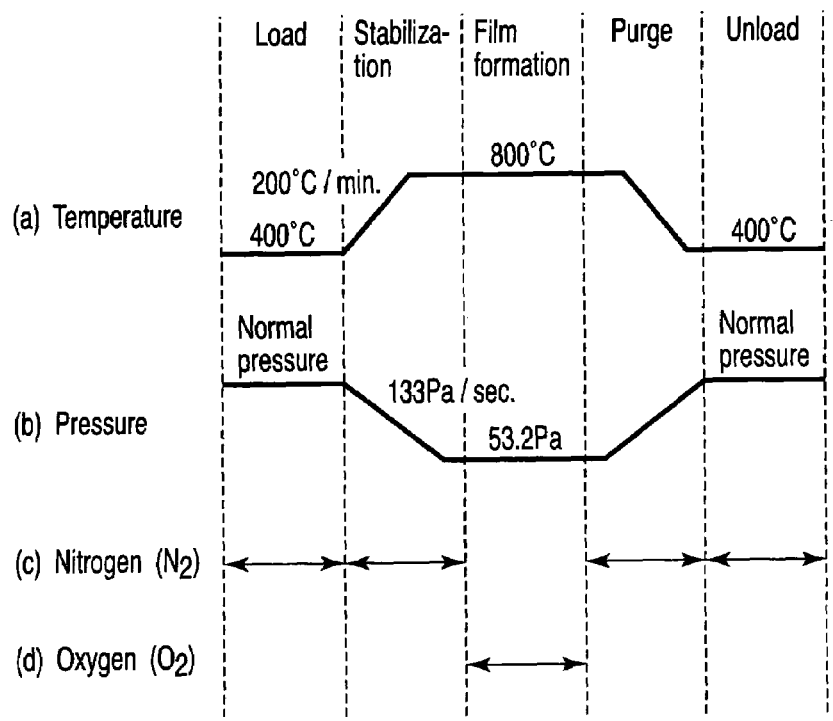
FIG. 2 is a view showing a recipe for explaining a heat-processing method according to an embodiment of the present invention.

FIG. 2 is a view showing a recipe for explaining a heat-processing method according to an embodiment of the present invention. This heat-processing method is organized to reduce the pressure-reducing rate of reducing the pressure in the reaction tube 2 during a stabilizing step shown in FIG. 2, so as to suppress deposition of particles on semiconductor wafers W.

At first, the interior of the reaction tube 2 is heated up (increase in temperature) by the heater 16 to a predetermined load temperature, such as 400° C., as shown in FIG. 2-(a). Also, as shown in FIG. 2-(c), a predetermined amount of nitrogen gas is supplied through the purge gas supply line 18 into the reaction tube 2. In this state, a wafer boat 11 that supports semiconductor wafers W is placed on the lid 6, and the lid 6 is moved up by the boat elevator (not shown) to airtightly close the reaction tube 2 (load step).

Then, as shown in FIG. 2-(c), a predetermined amount of nitrogen gas is supplied through the purge gas supply line 18 into the reaction tube 2. Also, the interior of the reaction tube 2 is heated up by the heater 16 to a predetermined film-formation temperature (process temperature), such as 800° C., at a heat-up rate of, e.g., 200° C./min, as shown in FIG. 2-(a). Furthermore, gas within the reaction tube 2 is exhausted, and the pressure in the reaction tube 2 is thereby reduced to a predetermined pressure, such as 53.2 Pa (0.4 Torr), as shown in FIG. 2-(b). This pressure-reducing operation is set to be slower than 266 Pa/sec (2 Torr/sec), and, for example, at a pressure-reducing rate of 133 Pa/sec (1 Torr/sec), as shown in FIG. 2-(b), so as to reduce the pressure in the reaction tube 2 to 53.2 Pa (0.4 Torr). This pressure-reducing and heating operation is kept performed until the reaction tube 2 is stabilized at the predetermined pressure and temperature (stabilizing step).

The thermal expansion coefficient of silicon, of which the semiconductor wafers W is made, differs from that of quartz, of which the wafer boat 11 is made. Accordingly, when the interior of the reaction tube 2 is heated, the semiconductor wafers W and the wafer boat 11 cause friction at the contacting portions therebetween due to this expansion difference, and thereby generate fragments (chippings) of them. Particularly, in this embodiment, since the interior of the reaction tube 2 is heated at a heat-up rate of 200° C./min, chippings are easily generated.

However, this embodiment uses a pressure-reducing rate lower than 266 Pa/sec (2 Torr/sec), and the period of time is thereby prolonged during which the interior of the reaction tube 2 is heated up under a higher pressure close to a normal pressure. In this case, generated chippings tend not to drop onto semiconductor wafers W therebelow, but to be exhausted (purged out) from the reaction tube 2 through the exhaust port 4 and exhaust line 5. As a consequence, even where a higher heat-up rate is used and chippings can be thereby easily generated, the generated chippings do not drop onto the semiconductor wafers W so many. In other words, even where a higher heat-up rate is used, it is possible to suppress deposition of particles on the semiconductor wafers W. On the other hand, the interior of the reaction tube 2 is heated from the load temperature to the process temperature at a heat-up rate of 200° C./min. Accordingly, the heat-processing apparatus 1 has a short TAT, and meets the "large item variable volume production" demand.

In order to easily purge out generated chippings from the reaction tube 2, the pressure-reducing rate is set to be lower than 266 Pa/sec (2 Torr/sec), but preferably to be 66.5 Pa/sec (0.5 Torr/sec) or more. Where the pressure-reducing rate is set to be lower than 66.5 Pa/sec (0.5 Torr/sec), it is difficult to obtain a short TAT (Turn Around Time). The pressure-reducing rate is preferably set to fall in a range of from 66.5 Pa/sec (0.5 Torr/sec) to 200 Pa/sec (1.5 Torr/sec), and more preferably from 66.5 Pa/sec (0.5 Torr/sec) to 133 Pa/sec (1 Torr/sec). Where the pressure-reducing rate is set to be lower than 200 Pa/sec (1.5 Torr/sec), generated chippings are more easily purged out from the reaction tube 2. Where the pressure-reducing rate is set to be lower than 133 Pa/sec (1 Torr/sec), generated chippings are furthermore easily purged out from the reaction tube 2.

In addition, according to this embodiment, a predetermined amount of nitrogen gas is supplied through the purge gas supply line 18 into the reaction tube 2. This helps generated chippings to be purged out from the reaction tube 2 through the exhaust port 4 and exhaust line 5. Because nitrogen gas supplied into the reaction tube 2 forms a gas flow within the reaction tube 2 from the purge gas supply line 18 to the exhaust port 4 (from the bottom to the top of the reaction tube 2), this urges generated chippings to move toward the exhaust port 4. As a consequence, the generated chippings can be scarcely transferred onto semiconductor wafers W therebelow, thereby preventing the chippings from being deposited on the semiconductor wafers W.

In order to easily purge out chippings from the reaction tube 2, the nitrogen gas supplied through the purge gas supply line 18 into the reaction tube 2 is preferably set at a large flow rate of, e.g., 10 liters/min or more, and more preferably 30 liters/min or more. However, if the supply rate of nitrogen gas through the purge gas supply line 18 is too high, it is difficult to control a low pressure within the reaction tube 2. For this reason, the supply rate is preferably set at 50 liters/min or less.

The motor of the rotary mechanism 13 is controlled to rotate the rotary table 10 along with the wafer boat 11. Since the semiconductor wafers W held on the wafer boat 11 are rotated along with the wafer boat 11, the semiconductor wafers W are uniformly heated.

After the interior of the reaction tube 2 is stabilized at the predetermined pressure and temperature, the supply of nitrogen gas through the purge gas supply line 18 is stopped. Then, as shown in FIG. 2-(d), a predetermined amount of oxygen is supplied through the process gas feed line 17 into the reaction tube 2. The oxygen supplied into the reaction tube 2 reacts with the surface of the semiconductor wafers W due to the heat in the reaction tube 2, and a silicon oxidation film is formed (film-formation step).

After a silicon oxidation film having a predetermined thickness is formed on the surface of the semiconductor wafers W, the supply of oxygen through the process gas feed line 17 is stopped. Then, the interior of the reaction tube 2 is exhausted, and, as shown in FIG. 2-(c), a predetermined amount of nitrogen gas is supplied through the purge gas supply line 18, to exhaust gas within the reaction tube 2 into the exhaust line 5 (purge step). In order to reliably exhaust gas from the reaction tube 2, it is preferable to perform cycle purge in which gas exhaust and nitrogen gas supply relative to the reaction tube 2 are repeated several times. Then, the interior of the reaction tube 2 is set at a predetermined temperature, such as 400° C., as shown in FIG. 2-(a), and the pressure in the reaction tube 2 is returned to a normal pressure, as shown in FIG. 2-(b). Finally, the lid 6 is moved down by the boat elevator (not shown) for unloading (unload step).

According to this heat-processing method, a pressure-reducing rate lower than 266 Pa/sec (2 Torr/sec) is used to prolong a period of time during which the interior of the reaction tube 2 is heated up under a higher pressure close to a normal pressure. In this case, generated chippings scarcely drop onto the semiconductor wafers W. As a consequence, even where a higher heat-up rate is used, it is possible to suppress deposition of particles on the semiconductor wafers W.

Also, according to this heat-processing method, a predetermined amount of nitrogen gas is supplied through the purge gas supply line 18 into the reaction tube 2, and urges generated chippings to be purged out from the reaction tube 2. As a consequence, the generated chippings can be scarcely transferred onto semiconductor wafers W therebelow, thereby preventing the chippings from being deposited on the semiconductor wafers W.

Figure 3:
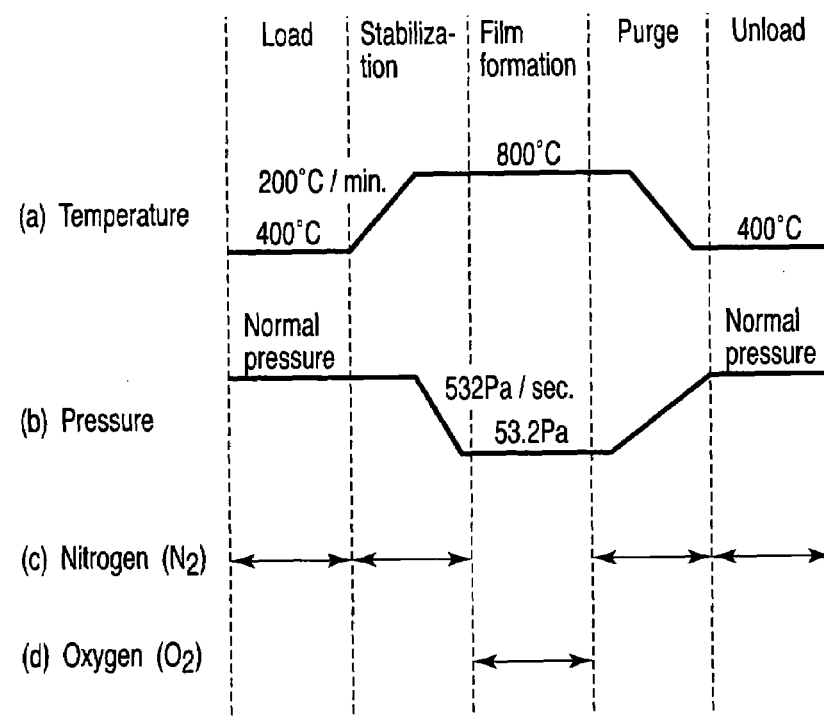
FIG. 3 is a view showing a recipe for explaining a heat-processing method according to another embodiment of the present invention.

FIG. 3 is a view showing a recipe for explaining a heat-processing method according to another embodiment of the present invention. This heat-processing method is organized to delay the timing of reducing the pressure in the reaction tube 2 during a stabilizing step shown in FIG. 3, so as to suppress deposition of particles on semiconductor wafers W.

At first, the interior of the reaction tube 2 is heated up (increase in temperature) by the heater 16 to a predetermined load temperature, such as 400° C., as shown in FIG. 3-(a). Also, as shown in FIG. 3-(c), a predetermined amount of nitrogen gas is supplied through the purge gas supply line 18 into the reaction tube 2. In this state, a wafer boat 11 that supports semiconductor wafers W is placed on the lid 6, and the lid 6 is moved up by the boat elevator (not shown) to airtightly close the reaction tube 2 (load step).

Then, as shown in FIG. 3-(c), a predetermined amount of nitrogen gas is supplied through the purge gas supply line 18 into the reaction tube 2. Also, the interior of the reaction tube 2 is heated up by the heater 16 to a predetermined process temperature, such as 800° C., at a heat-up rate of, e.g., 200° C./min, as shown in FIG. 3-(a). Then, as shown in FIG. 3-(b), one minute or more, such as three minutes, after the interior of the reaction tube 2 starts being heated up by the heater 16, gas within the reaction tube 2 starts being exhausted. At this time, the pressure in the reaction tube 2 is reduced to a predetermined pressure, such as 53.2 Pa (0.4 Torr), at a pressure-reducing rate of, e.g., 532 Pa/sec (4 Torr/sec).

As described above, the pressure in the reaction tube 2 starts being reduced, one minute or more after the interior of the reaction tube 2 starts being heated up. The period of time is thereby prolonged during which the interior of the reaction tube 2 is heated up (increase in temperature) under a higher pressure close to a normal pressure. In this case, generated chippings are easily purged out from the reaction tube 2 through the exhaust port 4 and exhaust line 5. Furthermore, a predetermined amount of nitrogen gas is supplied through the purge gas supply line 18 into the reaction tube 2, and the chippings are more easily purged out from the reaction tube 2. As a consequence, even where a higher heat-up rate is used and chippings can be thereby easily generated, the generated chippings do not drop onto the semiconductor wafers W so many. In other words, even where a higher heat-up rate is used, it is possible to suppress deposition of particles on the semiconductor wafers W. On the other hand, the interior of the reaction tube 2 is heated from the load temperature to the process temperature at a heat-up rate of 200° C./min. Accordingly, the heat-processing apparatus 1 has a short TAT, and meets the "large item variable volume production" demand.

In order to easily purge out generated chippings from the reaction tube 2, the timing of starting pressure-reducing is preferably set at two minutes or more after, and more preferably set at three minutes or more after the interior of the reaction tube 2 starts being heated up. However, if the timing is over-delayed, it is difficult to obtain a short TAT (Turn Around Time). For this reason, the timing is preferably set at 5 minutes or less thereafter.

The motor of the rotary mechanism 13 is controlled to rotate the rotary table 10 along with the wafer boat 11, so that the semiconductor wafers W are uniformly heated. This pressure-reducing and heating operation is kept performed until the reaction tube 2 is stabilized at the predetermined pressure and temperature (stabilizing step).

After the interior of the reaction tube 2 is stabilized at the predetermined pressure and temperature, the supply of nitrogen gas through the purge gas supply line 18 is stopped. Then, as shown in FIG. 3-(d), a predetermined amount of oxygen is supplied through the process gas feed line 17 into the reaction tube 2. The oxygen supplied into the reaction tube 2 reacts with the surface of the semiconductor wafers W due to the heat in the reaction tube 2, and a silicon oxidation film is formed (film-formation step).

After a silicon oxidation film having a predetermined thickness is formed on the surface of the semiconductor wafers W, the supply of oxygen through the process gas feed line 17 is stopped. Then, the interior of the reaction tube 2 is exhausted, and, as shown in FIG. 3-(c), a predetermined amount of nitrogen gas is supplied through the purge gas supply line 18, to exhaust gas within the reaction tube 2 into the exhaust line 5 (purge step). Then, the interior of the reaction tube 2 is set at a predetermined temperature, such as 400° C., as shown in FIG. 3-(a), and the pressure in the reaction tube 2 is returned to a normal pressure, as shown in FIG. 3-(b). Finally, the lid 6 is moved down by the boat elevator (not shown) for unloading (unload step).

According to this heat-processing method, the pressure in the reaction tube 2 starts being reduced, one minute or more after the interior of the reaction tube 2 starts being heated up. The period of time is thereby prolonged during which the interior of the reaction tube 2 is heated up (increase in temperature) under a higher pressure close to a normal pressure. In this case, generated chippings scarcely drop onto the semiconductor wafers W. As a consequence, even where a higher heat-up rate is used, it is possible to suppress deposition of particles on the semiconductor wafers W.

Also, according to this heat-processing method, a predetermined amount of nitrogen gas is supplied through the purge gas supply line 18 into the reaction tube 2, and urges generated chippings to be purged out from the reaction tube 2. As a consequence, the generated chippings can be scarcely transferred onto semiconductor wafers W therebelow, thereby preventing the chippings from being deposited on the semiconductor wafers W.

Figure 4:
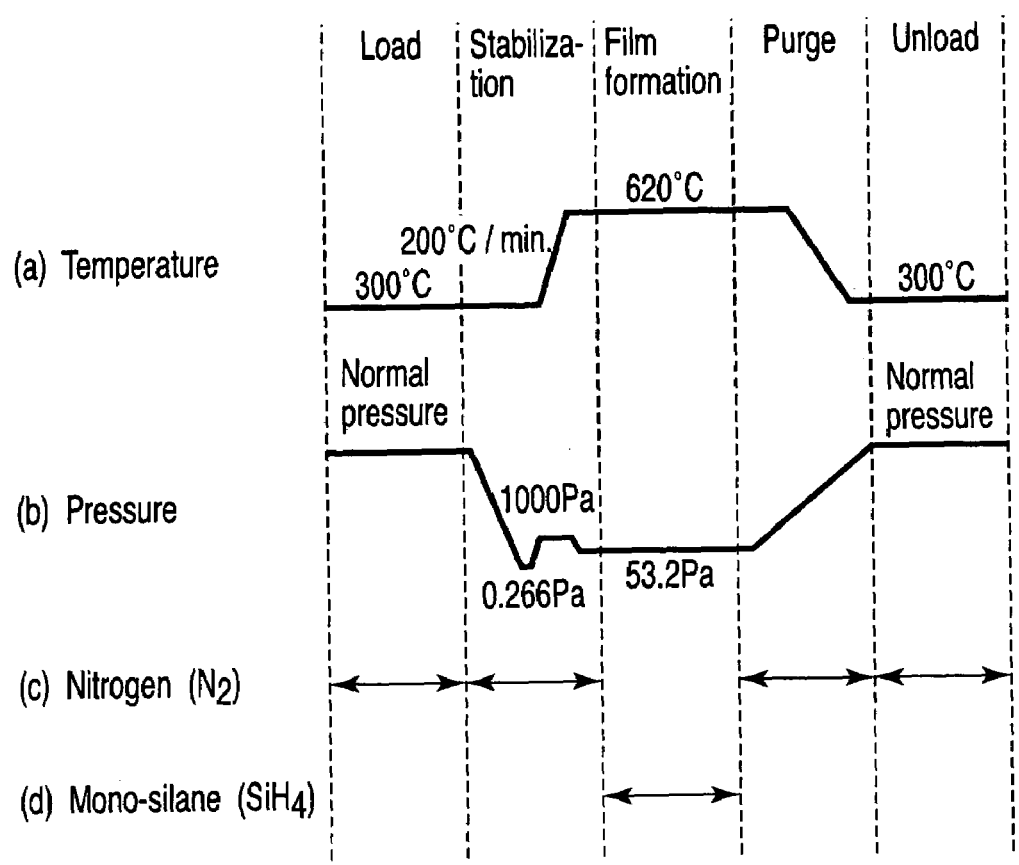
FIG. 4 is a view showing a recipe for explaining a heat-processing method according to still another embodiment of the present invention.

FIG. 4 is a view showing a recipe for explaining a heat-processing method according to still another embodiment of the present invention. This heat-processing method is organized to once reduce the pressure in the reaction tube 2 to a very low pressure (lower than the process pressure), and then heat up the interior of the reaction tube 2 to a predetermined temperature while keeping the pressure in the reaction tube 2 at a pressure for purging out chippings (higher than the process pressure), during a stabilizing step shown in FIG. 4, so as to suppress deposition of particles on semiconductor wafers W.

At first, the interior of the reaction tube 2 is heated up by the heater 16 to a predetermined load temperature, such as 300° C., as shown in FIG. 4-(a). Also, as shown in FIG. 4-(c), a predetermined amount of nitrogen gas is supplied through the purge gas supply line 18 into the reaction tube 2. In this state, a wafer boat 11 that supports semiconductor wafers W is placed on the lid 6, and the lid 6 is moved up by the boat elevator (not shown) to airtightly close the reaction tube 2 (load step).

Then, as shown in FIG. 4-(c), a predetermined amount of nitrogen gas is supplied through the purge gas supply line 18 into the reaction tube 2. Also, gas within the reaction tube 2 is exhausted to reduce the pressure in the reaction tube 2 temporarily to a very low pressure, such as 0.266 Pa (0.002 Torr), as shown in FIG. 4-(b). Where the pressure in the reaction tube 2 is once reduced to a very low pressure, atmospheric components in the reaction tube 2 can be almost completely exhausted. As a consequence, it is possible to suppress formation of a natural oxidation film on the semiconductor wafers W.

Then, the pressure in the reaction tube 2 is set at a pressure for purging out chippings, such as 1000 Pa (7.6 Torr), as shown in FIG. 4-(b). While the pressure in the reaction tube 2 is kept at 1000 Pa (7.6 Torr), the interior of the reaction tube 2 is heated up (increase in temperature) by the heater 16 to a predetermined process temperature, such as 620° C., at a heat-up rate of, e.g., 200° C./min, as shown in FIG. 4-(a). In other words, after the pressure in heating-up is set at a value for purging out chippings, the interior of the reaction tube 2 is heated up to the predetermined process temperature.

As described above, the interior of the reaction tube 2 is heated up to the predetermined process temperature, while the pressure in the reaction tube 2 is kept at a pressure for purging out chippings. In this case, generated chippings are easily purged out from the reaction tube 2. Furthermore, a predetermined amount of nitrogen gas is supplied through the purge gas supply line 18 into the reaction tube 2, and the chippings are more easily purged out from the reaction tube 2. In addition, since the pressure in the reaction tube 2 is once reduced to a very low pressure, and is then kept at a pressure for purging out chippings, a gas flow is formed within the reaction tube 2 from the bottom to the top (exhaust port 4) thereof. This flow urges generated chippings to move toward the exhaust port 4, so that the chippings are easily purged out from the reaction tube 2. As a consequence, even where a higher heat-up rate is used and chippings can be thereby easily generated, the generated chippings do not drop onto the semiconductor wafers W so many. In other words, even where a higher heat-up rate is used, it is possible to suppress deposition of particles on the semiconductor wafers W. On the other hand, the interior of the reaction tube 2 is heated from the load temperature to the process temperature at a heat-up rate of 200° C./min. Accordingly, the heat-processing apparatus 1 has a short TAT, and meets the "large item variable volume production" demand.

The pressure for purging out chippings is preferably set to fall in a range of from 133 Pa (1 Torr) to 2660 Pa (20 Torr), and more preferably of from 400 Pa (3 Torr) to 1330 Pa (10 Torr).

After the interior of the reaction tube 2 is heated up to the predetermined process temperature, gas within the reaction tube 2 is exhausted to reduce the pressure in the reaction tube 2 to a predetermined pressure, such as 53.2 Pa (0.4 Torr), as shown in FIG. 4-(b).

The motor of the rotary mechanism 13 is controlled to rotate the rotary table 10 along with the wafer boat 11, so that the semiconductor wafers W are uniformly heated. This pressure-reducing and heating operation is kept performed until the reaction tube 2 is stabilized at the predetermined pressure and temperature (stabilizing step).

After the interior of the reaction tube 2 is stabilized at the predetermined pressure and temperature, the supply of nitrogen gas through the purge gas supply line 18 is stopped. Then, as shown in FIG. 4-(d), a predetermined amount of mono-silane ($SiH_4$) is supplied through the process gas feed line 17 into the reaction tube 2. The mono-silane supplied into the reaction tube 2 is thermally decomposed due to the heat in the reaction tube 2, and a poly-silicon film is formed on the surface of the semiconductor wafers W (film-formation step).

After a poly-silicon film having a predetermined thickness is formed on the surface of the semiconductor wafers W, the supply of mono-silane through the process gas feed line 17 is stopped. Then, the interior of the reaction tube 2 is exhausted, and, as shown in FIG. 4-(c), a predetermined amount of nitrogen gas is supplied through the purge gas supply line 18, to exhaust gas within the reaction tube 2 into the exhaust line 5 (purge step). Then, the interior of the reaction tube 2 is set at a predetermined temperature, such as 300° C., as shown in FIG. 4-(a), and the pressure in the reaction tube 2 is returned to a normal pressure, as shown in FIG. 4-(b). Finally, the lid 6 is moved down by the boat elevator (not shown) for unloading (unload step).

According to this heat-processing method, the pressure in the reaction tube 2 is once reduced to a very low pressure, and then the interior of the reaction tube 2 is heated up while the pressure in the reaction tube 2 is kept at a pressure for purging out chippings. In this case, generated chippings are easily purged out from the reaction tube 2. As a consequence, even where a higher heat-up rate is used, it is possible to suppress deposition of particles on the semiconductor wafers W.

Also, according to this heat-processing method, the pressure in the reaction tube 2 is once reduced to a very low pressure, and atmospheric components in the reaction tube 2 can be almost completely exhausted. As a consequence, it is possible to suppress formation of a natural oxidation film on the semiconductor wafers W.

Furthermore, according to this heat-processing method, a predetermined amount of nitrogen gas is supplied through the purge gas supply line 18 into the reaction tube 2, and urges generated chippings to be purged out from the reaction tube 2. As a consequence, the generated chippings can be scarcely transferred onto semiconductor wafers W therebelow, thereby preventing the chippings from being deposited on the semiconductor wafers W.

Experiments were conducted to confirm whether the heat-processing methods described above can suppress deposition of particles on semiconductor wafers W. More specifically, a heat process was performed on semiconductor wafers W in accordance with each of the methods shown in the recipes of FIGS. 2 to 4, and then the heat-processed semiconductor wafers W were examined in terms of deposition of particles.

Figure 5A:
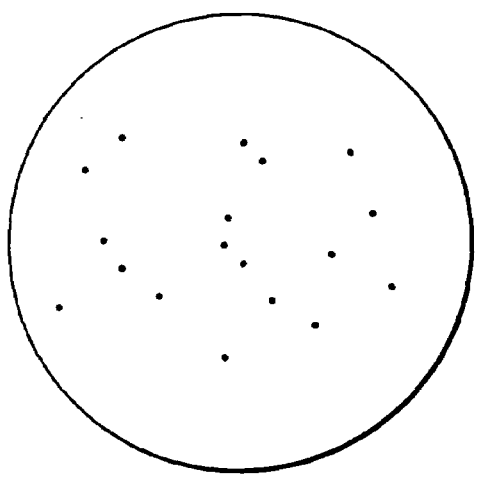
FIG. 5A to 5D are views showing states of deposition of particles on a semiconductor wafer, observed with changes in pressure-reducing timing and pressure-reducing rate.
Figure 5B:
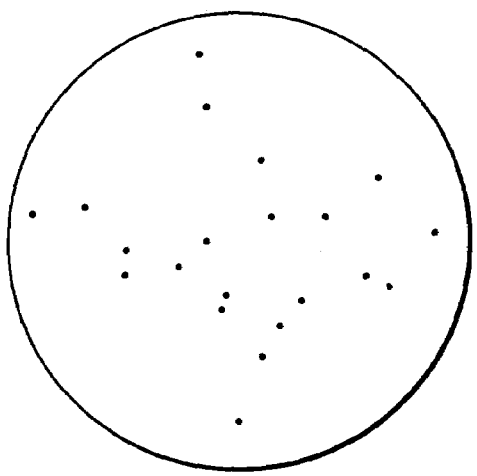
Figure 5C:
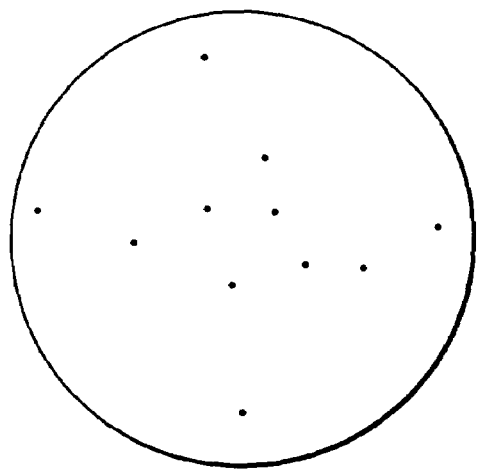
Figure 5D:
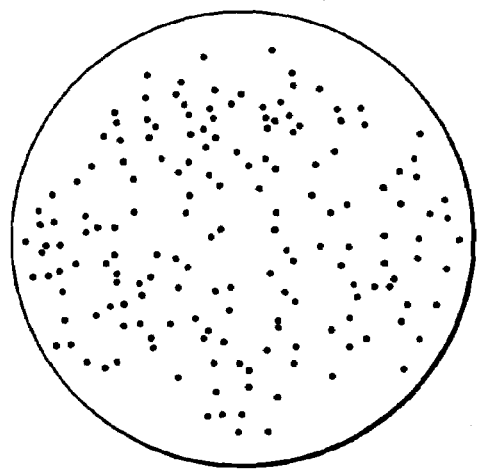

FIG. 5A to 5D are views showing states of deposition of particles on a semiconductor wafer, observed with changes in pressure-reducing timing and pressure-reducing rate. FIG. 5A shows a case where a heat process was performed on semiconductor wafers W in accordance with the method shown in the recipe of FIG. 3, in which the pressure-reducing timing was delayed during the stabilizing step. FIGS. 5B and 5C show cases where a heat process was performed on semiconductor wafers W in accordance with the method shown in the recipe of FIG. 2, in which the pressure-reducing rate was reduced during the stabilizing step. In these cases, the nitrogen gas supply rate in reducing the pressure was set at 1 liter/min in the case of FIG. 5B, and at 30 liters/min in the case of FIG. 5C. FIG. 5D shows a state of deposited particles, in a case where a process was performed on semiconductor wafers W in accordance with a comparative example method. In this comparative case, a heat process was performed on semiconductor wafers W in accordance with the method shown in the recipe of FIG. 2 except that a pressure-reducing rate of 532 Pa/sec (4 Torr/sec) was used, (in other words, in accordance with the method shown in the recipe of FIG. 3 except that the pressure-reducing timing was not delayed during the stabilizing step).

As shown in FIGS. 5A and 5D, where the pressure-reducing timing was delayed during the stabilizing step, the number of deposited particles observed on the semiconductor wafers W was considerably reduced, i.e., deposition of particles on the semiconductor wafers W was suppressed. Accordingly, it has been confirmed that the heat-processing method shown in the recipe of FIG. 3 is able to suppress deposition of particles on semiconductor wafers W.

As shown in FIGS. 5B and 5D, where the pressure-reducing rate was reduced during the stabilizing step, the number of deposited particles observed on the semiconductor wafers W was considerably reduced, i.e., deposition of particles on the semiconductor wafers W was suppressed. Accordingly, it has been confirmed that the heat-processing method shown in the recipe of FIG. 2 is able to suppress deposition of particles on semiconductor wafers W.

As shown in FIGS. 5B and 5C, where the nitrogen gas supply rate in pressure-reducing was set at a higher flow rate (30 liters/min), the number of deposited particles observed on the semiconductor wafers W was further reduced. Accordingly, it has been confirmed that a higher flow rate of the nitrogen gas supply in pressure-reducing is able to further suppress deposition of particles on semiconductor wafers W.

Additional experiments were conducted such that a heat process was performed using different set temperatures of the interior of the reaction tube 2, and then the heat-processed semiconductor wafers W were examined in terms of deposition of particles. Specifically, the additional experiments were directed to two cases, i.e., a case where the pressure-reducing timing was delayed during the stabilizing step, and a case where the pressure-reducing rate was reduced during the stabilizing step. In each case, the interior of the reaction tube 2 was heated up from a load temperature of 450° C. to a process temperature of 530° C. at a heat-up rate of 200° C./min. As a consequence, similarly to FIGS. 5A to 5C, in either of the cases where the pressure-reducing timing was delayed during the stabilizing step, and where the pressure-reducing rate was reduced during the stabilizing step, the number of deposited particles observed on the semiconductor wafers W was considerably reduced. Accordingly, it has been confirmed that heat-processing methods according to the present invention are not limited to those temperatures shown in the recipes of FIGS. 2 and 3.

FIGS. 6A and 6B are diagrams showing the number of deposited particles measured on a semiconductor wafer, in cases where a heat process was performed on semiconductor wafers W in accordance with the method shown in the recipe of FIG. 4, and then the heat-processed semiconductor wafers W were examined in terms of deposition of particles. As shown in FIGS. 6A and 6B, the heat-up rate was set at two values of 50° C./min and 100° C./min, and the pressure in heating-up was further set at different values. The number of deposited particles of 0.1 μm or more was measured on each of a semiconductor wafer W(T) at the top of the wafer boat 11, a semiconductor wafer W(C) at the middle of the wafer boat 11, and a semiconductor wafer W(B) at the bottom of the wafer boat 11.

As shown in FIGS. 6A and 6B, where the pressure in heating-up was set at a pressure for purging out chippings, the number of particles of 0.1 μm or more was considerably reduced. This becomes apparent by comparing cases employing different values of the pressure in heating-up, i.e., comparison of 100 Pa (0.76 Torr) at which chippings cannot be purged out, with a pressure at which chippings can be purged out (such as 133 Pa (1 Torr) or more). For example, in the case of a heat-up rate of 50° C./min and a semiconductor wafer W(T) at the top of the wafer boat 11, the number of particles of 0.1 μm or more deposited on the semiconductor wafer W was reduced by ⅓ or less (from 29 to 9) with a change in the pressure in heating-up from 100 Pa (0.76 Torr) to 240 Pa (1.8 Torr). This was so, because generated chippings were purged out from the reaction tube 2 where the pressure in heating-up was set at a pressure for purging out chippings. Accordingly, it has been confirmed that the heat-processing method shown in the recipe of FIG. 4 is able to suppress deposition of particles on semiconductor wafers W.

The present invention is not limited to the embodiments described above, and it may be modified or applied in various manners. Next, an explanation will be given of other embodiments according to the present invention.

In the embodiments described above, nitrogen is supplied through the purge gas supply line 18 during the stabilizing step of the heat-processing methods shown in FIGS. 2 to 4. However, nitrogen may not necessarily be supplied during the stabilizing step. The gas supplied during the stabilizing step may be another inactive gas, such as helium, argon, or neon, as long as it does not affect the heat process. Also in the case of another inactive gas, it is possible to suppress deposition of particles on semiconductor wafers W.

In the embodiments described above, oxygen or monosilane is supplied through the process gas feed line 17 into the reaction tube 2, so that a silicon oxidation film or poly-silicon film is formed on the surface of semiconductor wafers W. However, the present invention is not limited to this, and it may be applied to another case where a predetermined heat process is performed on a target substrate, such as a case where a silicon nitride film is formed on a target substrate.

In the embodiments described above, semiconductor wafers W are used as target substrates, and the quartz wafer boat 11 is used as a holder. However, the present invention is not limited to this, and it may be applied to a case where the materials of a target substrate and a holder form another combination, which satisfies the following condition. Specifically, the materials of the target substrate and the holder for holding the target substrate have different thermal expansion coefficients, and the target substrate and holder cause friction and generate chippings at the contacting portions therebetween due to the expansion difference.

In the embodiments described above, the heat-processing apparatus employed is a heat-processing apparatus of the batch type having a single-tube structure. However, for example, the present invention may be applied to a vertical heat-processing apparatus of the batch type having a reaction tube 2 of the double-tube type, which is formed of inner and outer tubes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heat-processing method for subjecting a plurality of target substrates to a heat process under a vacuum pressure, the method comprising:
   a transfer step of transferring into a reaction chamber a holder that supports the target substrates at predetermined intervals;
   a heating-up and pressure-reducing step, which follows the transfer step, of heating up an interior of the reaction chamber to a process temperature, and exhausting the interior of the reaction chamber to reduce pressure thereof to a process pressure; and
   a heat-processing step, which follows the heating-up and pressure-reducing step, of subjecting the target substrates to the heat process at the process temperature and the process pressure,
   wherein, during the heating-up and pressure-reducing step, the interior of the reaction chamber is heated up to the process temperature at a heat-up rate of 50° C./min to 200° C./min, and
   wherein, during the heating-up and pressure-reducing step, the interior of the reaction chamber is set at the process pressure after the interior of the reaction chamber is set at the process temperature, so as to form a state where the interior of the reaction chamber has the process temperature under a pressure higher than the process pressure.

2. The method according to claim 1, wherein the heating-up and pressure-reducing step comprises a step of exhausting the interior of the reaction chamber to reduce the pressure thereof, while heating up the interior of the reaction chamber.

3. The method according to claim 2, wherein the heating-up and pressure-reducing step is arranged to start exhausting the interior of the reaction chamber to reduce the pressure thereof, 1 to 5 minutes after starting heating up the interior of the reaction chamber.

4. The method according to claim 2, wherein the heating-up and pressure-reducing step is arranged to exhaust the interior of the reaction chamber to reduce the pressure thereof at a pressure-reducing rate of from 66.5 Pa/sec to 266 Pa/sec, while heating up the interior of the reaction chamber.

5. The method according to claim 1, wherein the heating-up and pressure-reducing step comprises a step of supplying an inactive gas into the reaction chamber while exhausting the interior of the reaction chamber.

6. The method according to claim 5, wherein the inactive gas is set at a supply rate of 10 liters/min or more.

7. The method according to claim 5, wherein the target substrate is a semiconductor wafer, which is supported by a quartz portion of the holder.

8. A heat-processing method for subjecting a plurality of target substrates to a heat process under a vacuum pressure, the method comprising:
- a transfer step of transferring into a reaction chamber a holder that supports the target substrates at predetermined intervals;
- a heating-up and pressure-reducing step, which follows the transfer step, of heating up an interior of the reaction chamber to a process temperature, and exhausting the interior of the reaction chamber to reduce pressure thereof to a process pressure; and
- a heat-processing step, which follows the heating-up and pressure-reducing step, of subjecting the target substrates to the heat process at the process temperature and the process pressure, wherein, during the heating-up and pressure-reducing step, the interior of the reaction chamber is set at the process pressure after the interior of the reaction chamber is set at the process temperature, so as to form a state where the interior of the reaction chamber has the process temperature under a pressure higher than the process pressure, and wherein the heating-up and pressure-reducing step comprises the steps of:
- exhausting the interior of the reaction chamber to reduce the pressure thereof to a first pressure lower than the process pressure;
- supplying an inactive gas into the reaction chamber while exhausting the interior of the reaction chamber, to increase the pressure of the interior of the reaction chamber to a second pressure higher than the process pressure;
- setting the interior of the reaction chamber to the process temperature under the second pressure; and
- exhausting and setting the interior of the reaction chamber to the process pressure.

9. The method according to claim 8, wherein the second pressure is a pressure for purging out chippings of the target substrate or the holder from the reaction chamber by exhausting.

10. The method according to claim 8, wherein the first pressure is set to be less than 133 Pa, and the second pressure is set to fall in a range of from 133 Pa to 2,660 Pa.

11. The method according to claim 8, wherein the inactive gas is set at a supply rate of 10 liters/min or more.

12. The method according to claim 8, wherein the target substrate is a semiconductor wafer, which is supported by a quartz portion of the holder.

13. The method according to claim 10, wherein the second pressure is set to fall in a range of from 400 Pa to 1,330 Pa.

14. The method according to claim 8, wherein, during the heating-up and pressure-reducing step, the interior of the reaction chamber is heated up to the process temperature at a heat-up rate of 50 °C./min to 200° C./min.

* * * * *